United States Patent [19]

Miyauchi et al.

[11] Patent Number: 4,730,328
[45] Date of Patent: Mar. 8, 1988

[54] WINDOW STRUCTURE SEMICONDUCTOR LASER

[75] Inventors: Nobuyuki Miyauchi; Shigeki Maei, both of Tenri; Osamu Yamamoto; Taiji Morimoto, both of Nara; Hiroshi Hayashi, Soraku; Saburo Yamamoto, Nara, all of Japan

[73] Assignee: Sharp Kabushiki Kaisha, Osaka, Japan

[21] Appl. No.: 787,760

[22] Filed: Oct. 15, 1985

[30] Foreign Application Priority Data

Oct. 16, 1984 [JP] Japan ............................... 59-217782

[51] Int. Cl.$^4$ ............................................... H07S 3/19
[52] U.S. Cl. ......................................... 372/46; 372/48
[58] Field of Search ....................... 372/44, 45, 46, 48; 357/17

[56] References Cited

U.S. PATENT DOCUMENTS 4,545,057 10/1985 Hayakawa et al. .................... 372/48

Primary Examiner—James W. Davie
Attorney, Agent, or Firm—Birch, Stewart, Kolasch & Birch

[57] ABSTRACT

A semiconductor laser comprising a substrate; a current blocking layer formed on said substrate; a striped channel formed in said current blocking layer on said substrate, said striped channel being narrow in the vicinity of the facets and being wide inside of the facets; an active layer, a portion of the active layer corresponds to the narrow portion of said striped channel being a plane to form a window region and another portion of the active layer corresponds to the wide portion of said striped channel being a crescent shape to form a laser operation area with a mesa-structure which is surrounded by burying layers to cut off current leakage from said laser operation area, the width of the mesa-portion of said laser operation area being not less than that of a current injection region formed within said striped channel.

9 Claims, 13 Drawing Figures

WINDOW STRUCTURE SEMICONDUCTOR LASER

BACKGROUND OF THE INVENTION

1. Field of the Invention

This invention relates to a semiconductor laser with improved high output power operation characteristics. More particularly, it relates to a semiconductor laser which is excellent in reliability at a high power output of 30 mW or more per facet and which can attain laser oscillation in a stabilized fundamental transverse mode up to such a high output power.

2. Description of the Prior Art

It is well known that stable operation of semiconductor lasers at a high output power is prevented by deterioration and/or damage to the light emitting-facets. The photon density in the vicinity of the facets is the highest, causing acceleration of the deterioration of the facets, so that absorption of laser light around the facets influences the life of semiconductor lasers to a great extent.

Window semiconductor lasers have been proposed which can be operated for a long period of time at a high output power. In these lasers facet-breakdown usually occurs when output power is increased, and the absorption of laser light around the facets is reduced to suppress deterioration of the facets. Examples of these layers are a window-stripe laser reported by Appln. Phys. Lett. 34(10), 15 May, 1979 p. 637 and a crank type TJS laser reported by Jpn. J. Appln. Phys. 21(1982) Supplement 21-1, p. 347. However, these window lasers do not have an optical waveguide in the direction parallel to the junction in the window region. Thus, laser light is propagated in the window region and the amount of reflected light from the facets to the laser operation area is reduced so that the oscillation efficiency is reduced, resulting in an increase in the oscillation threshold current level. FIG. 7 shows the propagation of laser light within a conventional window semiconductor laser, wherein window regions 2 and 2', respectively, are formed from both ends 5 and 5' (from which the laser light is propagated with a wave-front 6) of a striped laser operation area 1 to the facets 3 and 3' (from which laser beams are emitted).

Beam waists are positioned at the end portions 5 and 5' of the laser operation area 1 in the direction parallel to the junction, while they are positioned at the facets 3 and 3' in the direction vertical to the junction, resulting in an astigmatism. This astigmatism makes it difficult to concentrate light refracted by lenses, etc., in order to achieve optical coupling. In order to eliminate these drawbacks of the conventional window semiconductor laser, the applicant of this application for patent has filed Japanese Patent Application No. 57-91636 concerning a window semiconductor laser in which an optical waveguide is formed in the window regions. The features of this window laser are that the portion of the active layer in the vicinity of the facets is a plane shape and the portion of the active layer inside of the facets is a crescent shape, said crescent portion being formed into a buried heterostructure, and accordingly window regions are formed in the vicinity of the facets and a stabilized fundamental transverse mode can be attained up to a high output power. Due to the buried heterostructure of the crescent portion of the active layer, current which does not contribute to laser oscillation can be reduced so that laser oscillation in a high-order transverse mode can be suppressed. However, a part of the current injected into a channel on the substrate flows into the burying layers having a high resistance (namely, current leakage which does not contribute to laser oscillation arises), so that a necessarily high current level to achieve a high output power operation must be used and threshold current cannot be sufficiently reduced. Moreover, this type of laser lacks reliability in practical use.

SUMMARY OF THE INVENTION

The semiconductor laser of this invention which overcomes the above-discussed and numerous other disadvantages and deficiencies of the prior art, comprises a substrate; a current blocking layer formed on said substrate; a striped channel formed in said current blocking layer on said substrate, said striped channel being narrow in the vicinity of the facets and being wide inside of the facets; and active layer, a portion of the active layer corresponds to the narrow portion of said striped channel being a plane to form a window region and another portion of the active layer corresponds to the wide portion of said striped channel being a crescent shape to form a laser operation area with a mesa-structure which is surrounded by burying layers to cut off current leakage from said laser operation area, the width of the mesa-portion of said laser operation area being not less that that of a current injection region formed within said striped channel.

The current injection region is, in a preferred embodiment, composed of a striped mesa-portion of the substrate, which is exposed along the center line of the wide portion of said striped channel of the current blocking layer, and a striped V-shaped channel of the substrate, which is exposed along the center line of the narrow portion of said stripped channel of the current blocking layer.

The current injection region, is in another preferred embodiment, composed of a striped mesa-portion of the substrate, which is exposed along the center line of both the wide and narrow portions of said striped channel of the current blocking layer.

Thus, the invention described herein makes possible the objects of (1) providing a semiconductor laser in which the efficiency of contribution of the injection current to the laser oscillation operation is so high that stabilized laser oscillation can be attained at a high output power for a long period, and the threshold current level and the operation current level can be reduced; (2) providing a semiconductor laser in which a double-heterostructure inside of the laser operation area is surrounded by burying layers, so that current which does not contribute to laser oscillation can be blocked by the burying layers (namely, no that current leakage arises) and laser oscillation in a high-order transverse mode can be cut off, and thus laser oscillation can be attained in a stabilized fundamental transverse mode and stable operation characteristics can be established for high output power operation; and (3) providing a semiconductor laser in which an optical waveguide is formed not only in the laser operation are but also in window regions, so that beam waists are at positions in the facets which are parallel with and vertical to the junction (namely, astigmatism does not occur), and moreover the absorption of laser light near the facets can be reduced thereby achieving reliable operation at a high output power.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

The inventor found by experimentation that in the case where a VSIS (V-channeled substrate inner stripe) laser with a crescent active layer and a VSIS laser with a plane active layer are separately manufactured under the same crystal growth conditions, the former laser attains laser oscillation at a longer wavelength than the latter laser by from 100 to 200 Å, that is, the band-gap of the crescent active layer is narrower than that of the plane active layer by from 21 to 42 meV. Moreover, the curvature of the active layer makes the transverse mode less stable although the oscillation threshold current level becomes low, while the plane of the active layer makes the transverse mode stable, to a great extent, although the oscillation threshold current level becomes high. The above-mentioned experimental results suggest that if the concaved region is surrounded by burying layers to stabilize the transverse mode and the optical waveguide in each of these two kinds of active layers is connected with each other in a line, laser oscillation arises in the concaved region and the plane region serves only as a window which allows laser light to pass. Thus, if the plane region of the active layer is positioned in the vicinity of the facets, the level of the oscillation threshold current (Ith) in the resulting semiconductor laser will be reduced and a stabilized transverse mode will be attained. Moreover, a semiconductor laser having minimized deterioration of the facets and having great output power, Pmax for the facet-breakdown, can be produced.

(Example 1)

Figure 1:
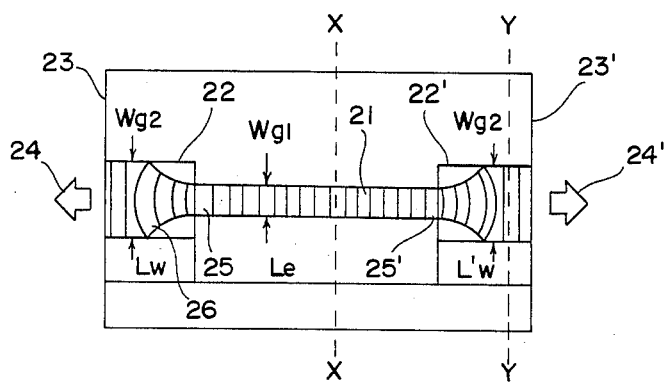
FIG. 1 is a plane view showing the laser light propagation of a window semiconductor laser of this invention.

FIG. 1 shows the propagation of laser light in a semiconductor laser of this invention, in which window regions 22 and 22' having a waveguide width $Wg_2$ and lengths Lw and L'w are connected to both ends 25 and 25' of a laser oscillation operation are (i.e., excitation area) 21, and laser beams 24 and 24' are irradiated from the facets 23 and 23', respectively. Laser light is propagated in the window regions with the wave-front 26.

Figures 2A, 2B:
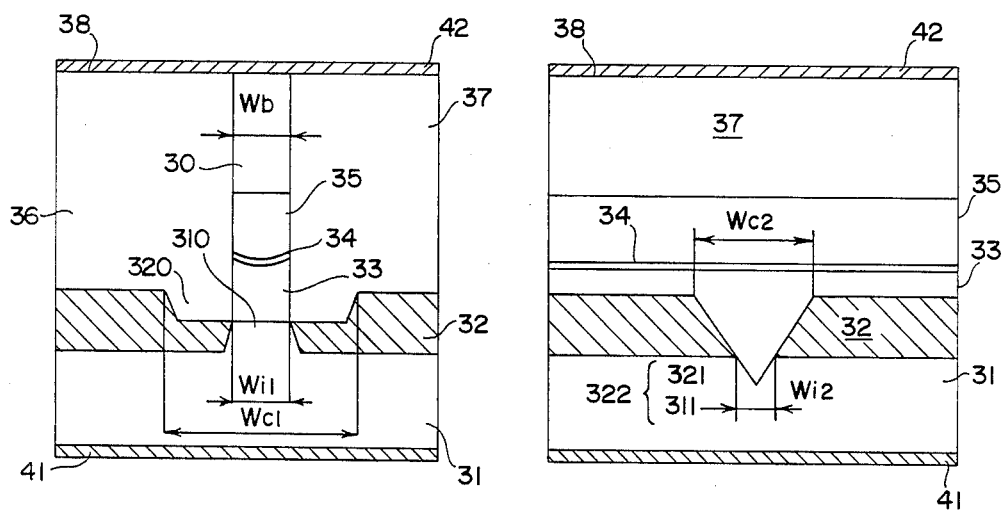
FIGS. 2(A) and 2(B), respectively, are sectional views of the X—X line and the Y—Y line in FIG. 1.

FIGS. 2(A) and 2(B), respectively, are sectional views showing the laser oscillation operation area 21 inside of the facets and the window region 22 (or 22') near the facets of the semiconductor laser shown in FIG. 1. This semiconductor laser comprises a p-GaAs substrate 31 and an n-GaAs current blocking layer 32 formed on the substrate 31. The n-GaAs current blocking layer 32 has a striped channel which is composed of a $Wc_1$ portion 320 and a $Wc_2$ portion 321 which are correspondent to the laser oscillation operation area 21 and the window regions 22 and 22', respectively. This semiconductor laser further comprises, in the window regions as shown in FIG. 2(B), a double heterostructure for laser operation composed of a p-cladding layer 33, an active layer 34, an n-cladding layer 35 and an n-cap layer 37. In the center portion as shown in FIG. 2(A), it further comprises an excitation area 30 having a mesa-structure composed of the p-cladding layer 33, the active layer 34, the n-cladding layer 35 and the n-cap layer 37, which are successively formed on a mesa-portion 310 of the substrate 31. The excitation area 30 having a mesa-structure is then surrounded by burying layers 36. The width of the $Wc_1$ channel portion 320 is greater than the width of the $Wc_2$ channel portion 321. The portion of the active layer 34 grown above the channel portion 320 with the width $wc_1$ results in a downward curvature functioning as an excitation area for laser oscillation, while the portion of the active layer 34 grown above the channel portion 321 with the width $Wc_2$ results in a plane shape functioning as a window region. When current is applied to the electrodes (41 and 42) on the bottom face of the substrate 31 and the top face 38 of the grown layers, it is injected into the active layer 34 through a mesa-portion 310 (having the width $Wi_1$) of the substrate 31 inside of the facets and through the V-shaped channel 311 (having the width $Wi_2$) of the substrate 31 in the vicinity of the facets, and laser oscillation begins. It is important that the width Wb of the mesa-portion 30 of the excitation area is not less than the width $Wi_1$ of the current injection portion 310. It is preferable that $Wi_1$ is equal to $Wi_2$.

Figure 4A:
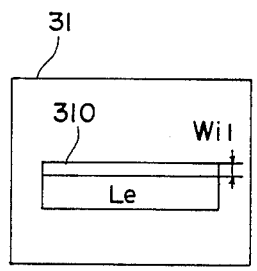
FIGS. 4(A)–4(D) and FIG. 5 are diagrammatical views showing production processes of the semiconductor laser shown in FIG. 1.
Figure 4B:
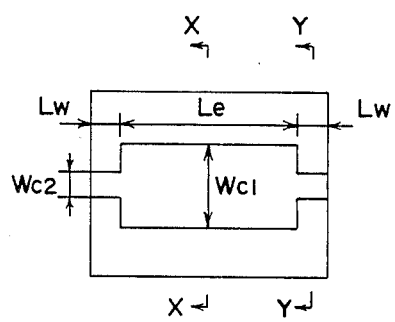
Figure 5:
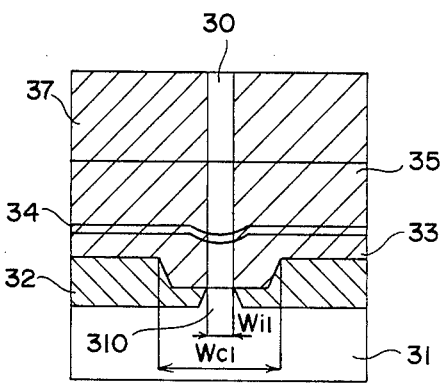
Figure 4C:
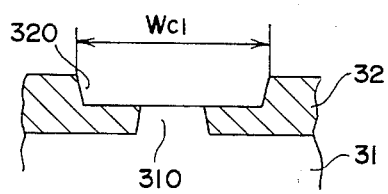
Figure 7:
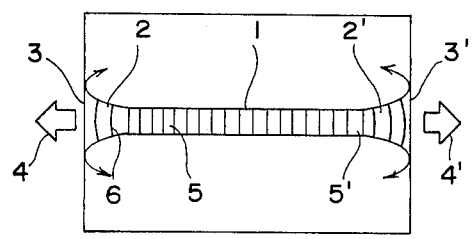
FIG. 7 is a plane view showing the laser light propagation of a conventional window semiconductor laser.
Figure 4D:
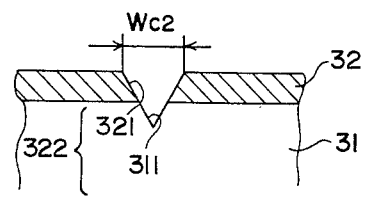

The above-mentioned semiconductor laser can be produced as follows: A Zn-doped p-GaAs substrate ($p=1\times10^{19}$ cm$^{-3}$) 31 is subjected to a mesa etching treatment using photolithography to form a striped mesa-portion 310 having a width $Wi_1$ of 2 μm and a length Le of 150 μm as shown in FIG. 4(A). Then, on the substrate 31, a Te-doped n-GaAs current blocking layer ($n=6\times10^{18}$ cm$^{-3}$) 32 is grown by liquid phase epitaxy. A striped channel pattern is then formed on the surface of the current blocking layer 32 by photolithography, as shown in FIG. 4(B), in such a manner that the width $Wc_1$ of the channel pattern inside of the facets is greater than the width $Wc_2$ of the channel pattern in the vicinity of the facets, wherein Le=150 μm, Lw=50 μm, $Wc_1$=6 μm and $Wc_2$=3 μm. The mesa-portion 310 is positioned in the center of the channel pattern with the width $Wc_1$, but it is not placed under the channel pattern with the width $Wc_2$. Based on the channel pattern, the current blocking layer 32 is subjected to an etching treatment with an etching solution containing sulfuric acid. FIGS. 4(C) and 4(D) show sectional views of the resulting striped channel which is composed of a $Wc_1$ portio 320 (the X—X line in FIG. 1) and a $Wc_2$ portion 322 (the Y—Y line in FIG. 1). As shown in FIG. 4(C), the mesa-portion 310 of the substrate 31 is exposed along the center line of the channel portion 320 having the width of $Wc_1$. As shown in FIG. 4(D), the V-shaped channel portion 322 having the width of $Wc_2$ reaches the substrate 31 through the current blocking layer 32. Then, by liquid phase epitaxy, a p-Ga$_{0.5}$Al$_{0.5}$As cladding layer 33, a p-Ga$_{0.85}$Al$_{0.15}$As active layer 34 and an n-Ga$_{0.5}$Al$_{0.5}$As cladding layer 35 are successively grown with thicknesses of 0.15 μm, 0.05 μm and 1 μm, respectively, in the plane portion of each thereof. On the n-cladding layer 35, an n-cap layer 37 is formed to achieve ohmic contact with an electrode thereon. The excitation area in the center portion shown in FIG. 5 is mesa-etched with an etching solution containing sulfuric acid to eliminate the portion ranging from the top face of the grown layers to the surface of the current blocking layer 32, resulting in the remaining portion of the grown layers which acts as a mesa for laser operation which is in contact with the mesa-portion 310 of the substrate 31. The width Wb of the mesa-portion 30 of the laser operation area is slightly greater than the width Wi of the mesa-portion 310 of the substrate 31. Then, p-$Ga_{0.5}Al_{0.5}As$ burying layers 36 having a high electrical resistance are grown by liquid phase epitaxy to surround the mesa-portion 30, followed by subjecting the back of the substrate 31 to a wrapping treatment with a proper material to result in the substrate 31 with a thickness of approximately 100 μm. Then, the surface 38 of the grown layers and the back of the substrate 31 are subjected to a vacuum evaporation treatment with metal materials of Au-Ge-Ni and Au-Zn, respectively, followed by heating at 450° C. to form electrode layers 42 and 41 made of an alloy of Au-Ge-Ni and an alloy of Au-Zn, respectively. Then, Al is vacuum-evaporated on the back of the p-GaAs substrate 31.

The resulting window semiconductor laser attained laser oscillation in a stabilized fundamental transverse mode at a wavelength of 7800 Å at a threshold current of 15 mA up to the maximum output power, Pmax for the facet-breakdown, of 100 mW. When the facets were coated with an $Al_2O_3$ film, the Pmax was increased up to approximately 200 mW.

Another window semiconductor laser which has an oscillation wavelength of 8300 Å exhibited a Pmax of 200 mW when the facets were not coated with an $Al_2O_3$ film, and exhibited a Pmax of 400 mW when the facets were coated with an $Al_2O_3$ film.

Since the double heterostructure 30 for laser operation is constituted by a mesa-structure, the width Wb of which is the same as or greater than the width $Wi_1$ of the mesa-portion 310 of the substrate 31 within the channel portion 320 and which is in contact with the mesa-portion 310, and moreover the burying layers 36 surrounding the mesa-structure 30 are in contact with the electroconductive region in the channel, current applied to the mesa-portion 310 can be injected into the excitation area of the active layer 34 without leakage. Thus, the efficiency of the contribution of the injected current to laser oscillation becomes extremely high thereby enabling a high output power operation at a low threshold current level and at a low injection current level.

It was observed that the above-mentioned window lasers having wavelengths of 7800 Å and 8300 Å, respectively, could attain continuous operation without deterioration at an output power ranging from 40 to 50 mW at 50° C. for a long period.

(EXAMPLE 2)

Figure 3:
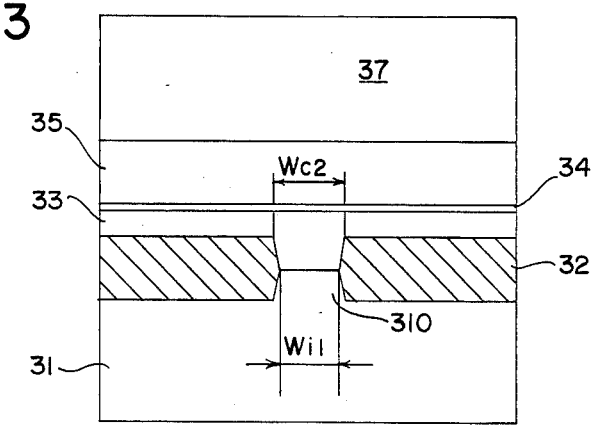
FIG. 3 is a sectional view of another semiconductor laser of this invention at the portion corresponding to the Y—Y line in FIG. 1.

FIG. 3 shows the sectional view another semiconductor laser of this invention at the portion corresponding to the Y—Y line in FIG. 1. The sectional view thereof at the portion corresponding to the X—X line in FIG. 1 is the same as that in FIG. 2(A) showing the semiconductor laser in Example 1.

The semiconductor laser in this Example comprises a substrate 31 having the striped mesa-portion 310 over the whole are (which corresponds to the laser operation area 21 and the window regions 22 and 22') of the resonator, although the semiconductor laser in Example 1 comprises the substrate 31 having the mesa-portion 310 in the portion corresponding to the laser operation alone area (i.e., the center portion of the resonator) 21. Thus, the width of the current injection region of the laser is, as the whole, the width $Wi_1$ of the mesa-portion 310 of the substrate 31.

Figure 6A:
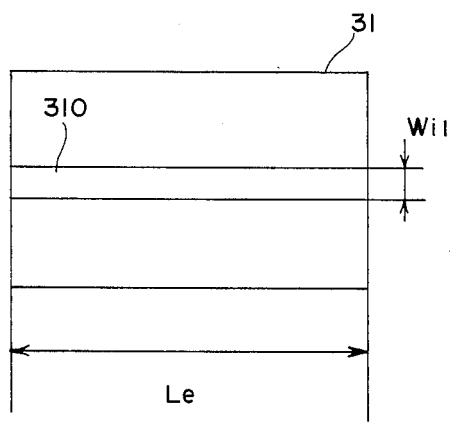
FIGS. 6(A)–6(C) are diagrammatical views showing production processes of the semiconductor laser shown in FIG. 3.
Figure 6B:
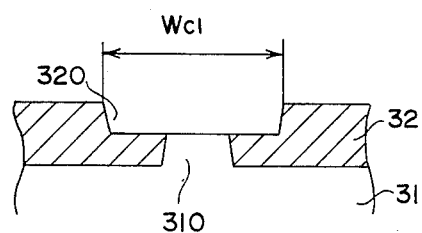
Figure 6C:
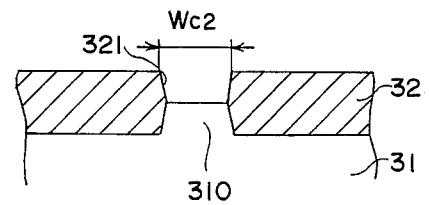

This semiconductor laser can be produced as follows: A Zn-doped p-GaAs substrate ($p=1\times10^{19}$ cm$^{-3}$) 31 is subjected to a mesa etching treatment using photolithography to form a striped mesa-portion 310 having a width $wi_1$ of 2 μm over the whole length (250 μm) of the substrate 31 as shown in FIG. 6(A). Then, on the substrate 31, a Te-doped n-GaAs current blocking layer ($n=6\times10^{18}$ cm$^{-3}$) 32 is grown by liquid phase epitaxy. A striped channel pattern is then formed on the surface of the current blocking layer 32 by photolithography in such a manner that, as shown in FIG. 4(B), the width $Wc_1$ of the channel pattern inside of the facets is greater than the width $Wc_2$ of the channel pattern in the vicinity of the facets. Each portion of the channel pattern is the same shape and size as that of the channel pattern in Example 1. Based on the channel pattern, the current blocking layer 32 is subjected to an etching treatment with an etching solution containing sulfuric acid, resulting in a striped channel composed of a $Wc_1$ portion 320 and a $Wc_2$ portion 321 as shown in FIG. 6(B) and 6(C), respectively. The mesa-portion 310 of the substrate is exposed along the center line of both the channel portion 320 (corresponding to the laser oscillation operation area 21) and the channel portion 321 (corresponding to the window regions 22 and 22'). Then, the double heterostructure is successively formed by an epitaxial growth technique in the same manner as described in Example 1, resulting in the desired window semiconductor laser. This window semiconductor laser exhibited the same laser oscillation operation characteristics as obtained in Example 1.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty which reside in the present invention, including all features which would be treated as equivalents thereof by those skilled in the art to which this invention pertains.

What is claimed is:

1. A semiconductor laser comprising:
   a substrate,
   a current blocking layer formed on said substrate,
   a striped channel portion formed in said current blocking layer on said substrate so as to form a current injection region, said striped channel portion having a middle channel section and end channel sections disposed at both ends of said middle channel section, said middle channel section being wider than said end channel sections; and
   an active layer operatively associated with said striped channel portion and said substrate, said active layer having planar portions formed at positions corresponding to said end channel sections to form window regions and said active layer having a concave-shaped portion formed at a position which corresponds to said middle channel section to form a laser operation area;

wherein said active layer is incorporated into a mesa-shaped operation portion, said mesa-shaped operation portion is surrounded by burying layers to cut off current leakage from said laser operation area, and the width of said mesa-shaped operation portion is not less than the width of said current injection region formed within said striped channel portion.

2. The semiconductor laser according to claim 1, wherein said current injection region comprises (1) a striped mesa-shaped current portion formed on said substrate, said mesa-shaped current portion being exposed along the center of said middle channel section of said striped channel portion, and (2) a striped V-shaped current channel portion formed in said substrate, said V-shaped current channel portion being exposed along the center of said end channel sections of said striped channel portion.

3. The semiconductor laser according to claim 1, wherein said current injection region comprises a striped mesa-shaped current portion formed on said substrate, said mesa-shaped current portion being exposed along the center of said middle channel section and said end channel sections of said striped channel portion.

4. A window structure semiconductor laser comprising:
a substrate;
a first electrode formed on a first side of said substrate;
a current blocking layer formed on a second side of said substrate;
a striped channel portion formed in said current blocking layer, said striped channel portion having a middle channel section and end channel sections disposed at both ends of said middle channel section wherein said middle channel section is wider than said end channel sections, said striped channel portion having a current injection region formed at a lower portion of said striped channel portion;
a first cladding layer formed on said current blocking layer;
an active layer formed on said cladding layer, said active layer having a concave-shaped portion formed at a position corresponding to said middle channel section and planar portions formed at positions corresponding to said end channel sections, wherein said concave-shaped portion of said active layer forms a laser operation area;
a second cladding layer formed on said active layer;
a cap layer formed on said second cladding layer;
said first cladding layer, said active layer, said second cladding layer, and said cap layer forming a mesa-shaped operation portion at a position corresponding to said middle channel section;
burying layers formed on said current blocking layer and along the lateral sides of said mesa-shaped operation portion to bury at least the lateral sides of said laser operation area, thereby cutting off current leakage from said laser operation area; and
a second electrode formed on said cap layer;
wherein the width of said mesa-shaped operation portion is not less than the width of said current injection region.

5. The semiconductor laser according to claim 4, wherein said current injection region comprises (1) a striped mesa-shaped current portion formed on said substrate, said mesa-shaped current portion being exposed along the center of said middle channel section of said striped channel portion, and (2) a striped V-shaped current channel portion formed in said substrate, said V-shaped current channel portion being exposed along the center of said end channel sections of said striped channel portion.

6. The semiconductor laser according to claim 4, wherein said current injection region comprises a striped mesa-shaped current portion formed on said substrate, said mesa-shaped current portion being exposed along the center of said middle channel section and said end channel sections of said striped channel portion.

7. The semiconductor laser according to claim 5, wherein said mesa-shaped current portion has a width equal to the width of said striped V-shaped current channel portion.

8. The semiconductor laser device according to claim 4, wherein said substrate comprises Zn-doped p-GaAs, said current blocking layer comprises Te-doped n-GaAs, said first cladding layer and said active layer comprises p-GaAlAs, said second cladding layer comprises n-GaAlAs, said cap layer is a n-cap layer, said burying layers comprise p-GaAlAs, said first electrode comprises an alloy of Au-Zn, and said second electrode comprises and alloy of Au-Ge-Ni.

9. The semiconductor laser device according to claim 4, wherein at wavelengths of 7800 and 8300 angstroms said device attains continuous operation without deterioration at an output power ranging from 40 to 50 mW.

* * * * *